United States Patent [19]

Kowalski

[11] Patent Number: 5,473,564
[45] Date of Patent: Dec. 5, 1995

[54] MEMORY CARD HAVING AN INTEGRATED CIRCUIT FOR THE SECURE COUNTING DOWN OF UNITS

[75] Inventor: Jacek A. Kowalski, Trets, France

[73] Assignee: Gemplus Card International, Gemenos, France

[21] Appl. No.: 221,166

[22] Filed: Mar. 31, 1994

[30] Foreign Application Priority Data

Apr. 1, 1993 [FR] France ................ 93 03836

[51] Int. Cl.[6] ................ G11C 16/06
[52] U.S. Cl. ................ 365/185.1; 365/230.06; 365/236
[58] Field of Search ................ 365/185, 218, 365/900, 230.06, 230.03, 236

[56] References Cited

U.S. PATENT DOCUMENTS

| | | | |
|---|---|---|---|
| 4,827,450 | 5/1989 | Kowalski | 365/185 |
| 4,868,489 | 9/1989 | Kowalski | 324/61 |
| 4,881,199 | 11/1989 | Kowalski | 365/189.01 |
| 4,890,187 | 12/1989 | Kowalski et al. | 361/111 |
| 4,896,298 | 1/1990 | Kowalski | 365/189.01 |
| 4,916,333 | 4/1990 | Kowalski | 307/296.5 |
| 5,003,371 | 3/1991 | Kowalski et al. | 357/42 |
| 5,022,001 | 6/1991 | Kowalski et al. | 365/185 |
| 5,060,198 | 10/1991 | Kowalski | 365/201 |
| 5,060,261 | 10/1991 | Kowalski et al. | 380/3 |
| 5,097,146 | 3/1992 | Kowalski et al. | 307/305 |
| 5,191,498 | 3/1993 | Kowalski | 361/1 |
| 5,414,664 | 5/1995 | Lin et al. | 365/185 |

FOREIGN PATENT DOCUMENTS

| | | |
|---|---|---|
| 447856 | 9/1991 | European Pat. Off. ........ 365/185 |
| WO92/06451 | 4/1992 | European Pat. Off. . |
| 0321727 | 6/1989 | France . |
| WO92/15096 | 9/1992 | France . |
| WO92/15074 | 9/1992 | France . |
| 0519847 | 12/1992 | France . |
| WO93/05513 | 3/1993 | France . |
| WO93/15477 | 8/1993 | France . |

*Primary Examiner*—Joseph E. Clawson, Jr.
*Attorney, Agent, or Firm*—Nilles & Nilles

[57] ABSTRACT

In a memory card designed to count down a number of units by successive programming of non-volatile, electrically erasable and electrically programmable memory cells, the memory is organized into N rows of P cells, the weight of the cells of one row in the account being P times the weight of the next-ranking row. The countdown procedure is recurrent and consists in making a search, in scanning the memory according to the rising order of weights, of an erased cell, programming this cell and an erased cell and then erasing the entire row having an immediately lower rank unless the erased cell is located in the first row, and in recommencing this recurrent procedure until an erased cell is found in the first line. The auxiliary cell enables the detection of an abnormal interruption of the recurrent procedure and the restoring of the exact account of the memory which could have been distorted by this abnormal interruption.

8 Claims, 3 Drawing Sheets

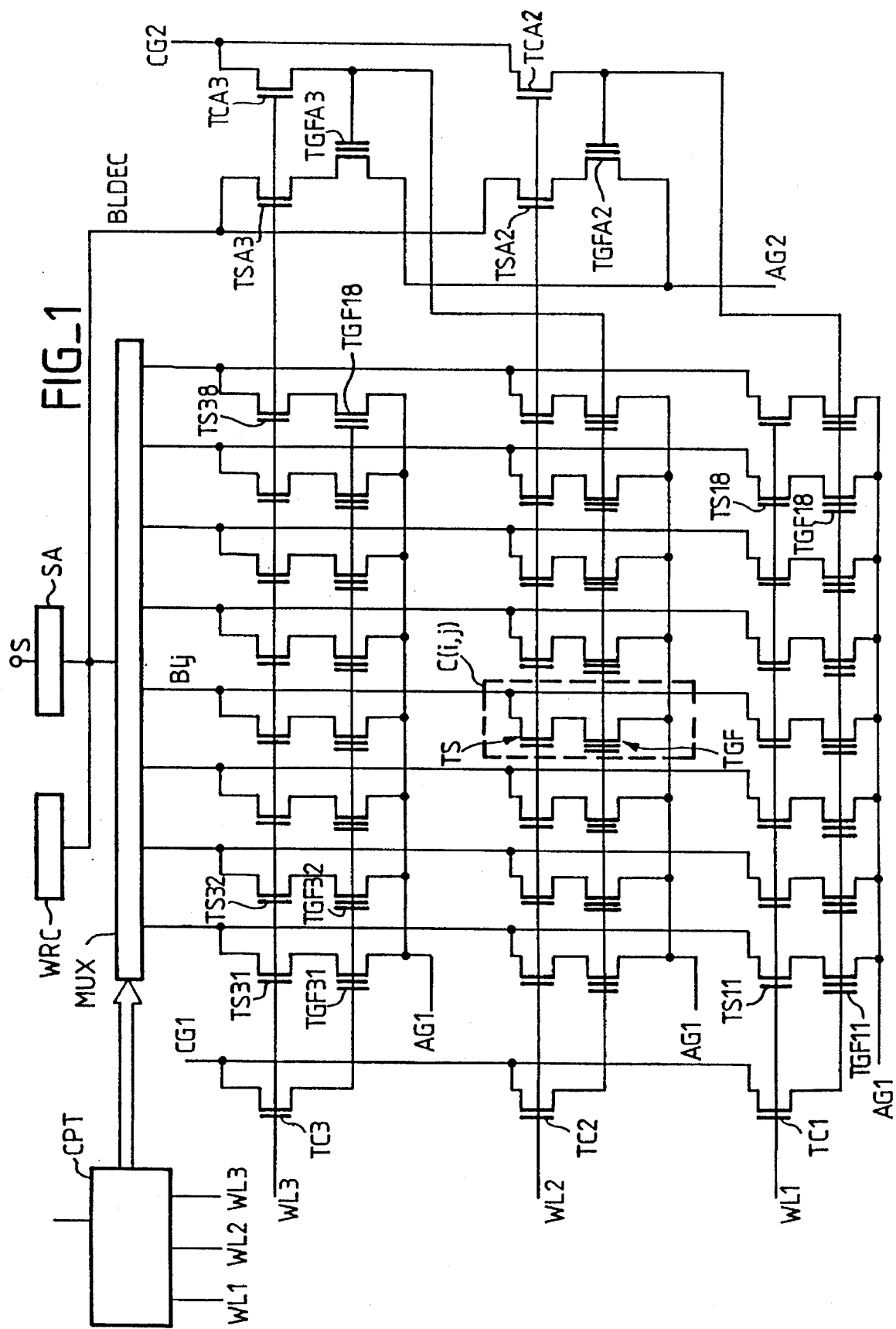
FIG_1

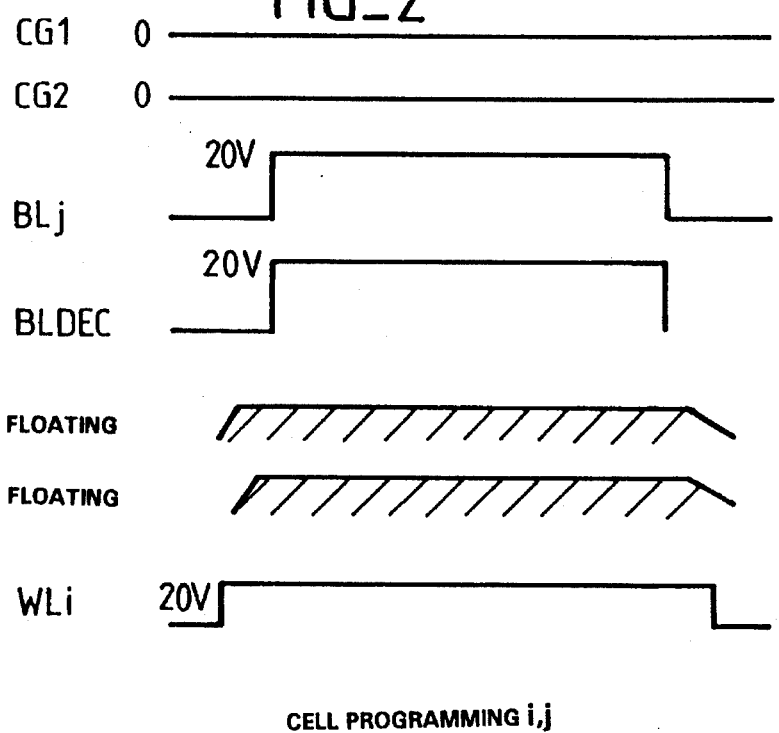
CELL PROGRAMMING i,j
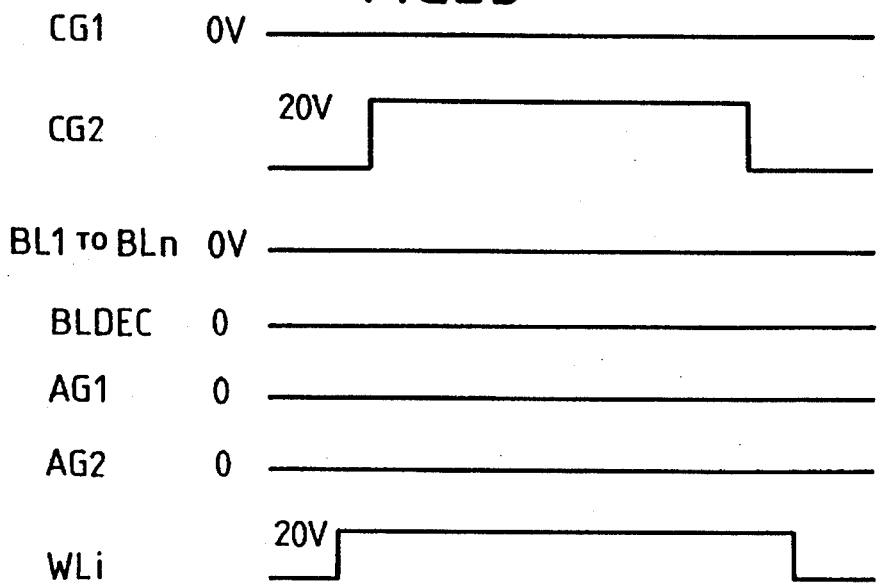
ERASURE OF ROW i-1

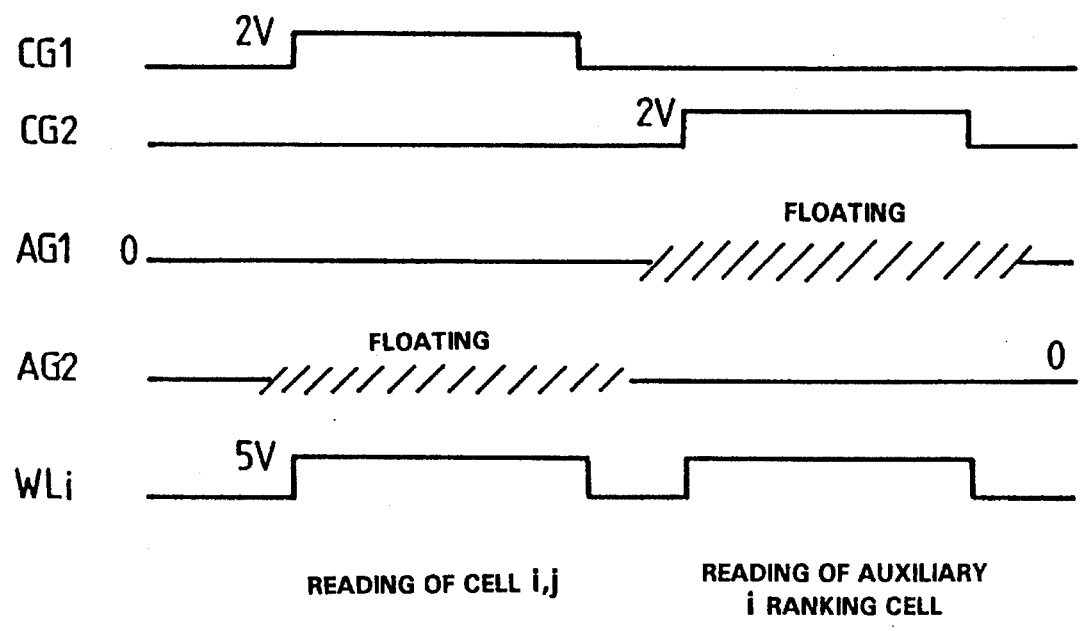

MEMORY CARD HAVING AN INTEGRATED CIRCUIT FOR THE SECURE COUNTING DOWN OF UNITS

BACKGROUND OF THE INVENTION

1. Field of the Invention

The invention relates to chip cards and, more especially, to cards used as a means of prepayment for the counting down (or counting out) of units as and when goods or services are used. However, the invention is not limited to this use of chip cards: it relates more generally to applications in which units have to be counted up or counted down by means of a programming of non-volatile electrically erasable, programmable memory (EEPROM) cells.

2. Description of the Prior Art

In microprocessor-based chip cards, which are also called asynchronous cards, the counting methods are efficient, adaptable to the application and protected against fraud or operating errors. However, in cards without microprocessors or in synchronous cards (which have the advantage of being less costly), the methods are less versatile and less sure.

The principle of the counting, which today appears to be the principle best suited to synchronous cards, is the abacus principle which makes it possible, with a small number of EEPROM cells, to count out a large number of units. The advantage of this principle is that it is easy to make and hence that its cost is not excessively high.

In abacus-type counting, the memory is organized into N zones of P cells, in practice N rows of P cells. The number of cells programmed in a row is a figure representing the number of units memorized and the rank or order number of the row represents the weight of this figure. The weight assigned to a row is P times the weight of the immediately lower ranking or lower order row. The total count of units is the sum of the numbers of cells programmed in each row, these numbers being weighted by the weight of the respective row.

For example, with a memory of three rows of eight cells each, respectively having x cells, y cells and z cells on the first, second and third row having respective weights of $8^0$, $8^1$ and $8^2$ namely 1, 8 and 64, the total count of units represented by the memory is: $x+8y+64z$. This 24-cell memory can count up from 0 to 584 units and count down from 584 to 0.

By convention, it is assumed here below that the erased cell is represented by a logic "1" and that the programmed cell is represented by a logic "0", and it will therefore be assumed that the memory to count the units down from an initial total rather than count them up by incrementing this total. The reverse would of course be obtained by the use of reverse conventions.

Let it be assumed, for example, returning to the example of a memory with three rows of eight cells, that the initial count is 194 (expressed in terms of a decimal number), i.e. $z=3$, $y=0$, $x=2$.

The initial pattern of the memory is:

| | | |
|---|---|---|
| 11100000 | z = 3 | 3 × 64 = 192 |
| 00000000 | y = 0 | +0 × 8 = 0 |
| 11000000 | x = 2 | +2 × = 2 |
| | | Total: 194 |

The countdown by one unit will consist in programming an erased cell of the last row at zero, taking x to 1 and taking the count to 191; to make a countdown by yet another unit, another cell of the last row is programmed, taking x to 0 and the count to 192.

The pattern of the 24 cells of the memory then becomes:

| | |
|---|---|
| 11100000 | |
| 00000000 | |
| 00000000 | count: 192 |

Here the problem becomes more difficult since it is no longer possible to program cells with a unit weight.

Consequently, there is prepared an intermediate sequence that is proper to abacus-type counting and consists, in this example, of:

a./ the programming, at 0, of a cell at 1 of the first row (in fact, the first cell at 1 that is encountered in making a trace-back from the last row to the first row; here it is a cell of the first row since there are none in the second): the pattern becomes:

11000000
00000000
00000000 b./ the erasing of the entire second row (i.e. the erasing of the entire row that follows a row in which a programming is done); the pattern becomes:

| | |
|---|---|
| 11000000 | |
| 11111111 | |
| 00000000 | the count is truly 192 as before. |

However, it is not always possible to make a unit-by-unit countdown since there is no erased cell on the lightweight row; then the same sequence as above, i.e. a followed by b, is carried out again:

a'./ the programming, at 0, of the first cell at 1 encountered in making a trace-back from the last row to the first row; the pattern becomes:

11000000
11111110
00000000 b'./ the erasing of the entire row that follows the row in which a programming has just been done; the pattern becomes:

| | |
|---|---|
| 11000000 | |
| 11111110 | |
| 11111111 | the count is still 192. |

However, it is now possible to make a unit-by-unit countdown by the successive programming of the cells of the row with the lightest weight.

The principle of the countdown by one unit therefore consists in carrying out the following recurrent procedure: making a search in the memory, by going through it in the rising order of weights, for an erased cell (at 1), programming this cell (putting it at 0) and, if it does not belong to the row with the lightest weight, erasing (placing at 1) the entire row of an immediately lower rank and recommencing the procedure.

However, it has been observed that this recurrent procedure, while it is fairly simple, could have drawbacks: if the intermediate patterns of the memory during the steps a and a' of the recurrence are looked at again, it is seen that the account contained in the memory at the end of these steps is respectively 128 and 184 whereas it ought to be 192 since these steps are only intermediate steps performed when there has not yet been any counting down by one unit.

Consequently if, by chance, the current should be cut off during these steps, for example by the wrenching of the card out of its reader, then the memory will keep an erroneous account which bears no relation whatsoever to the real account.

It will be understood that, in certain applications, this may have major drawbacks. This is so, for example, if the account in the memory represents an available credit for the bearer: a portion of this credit will be permanently lost. In other applications, the opposite could be the case. In any case, this situation is not desirable.

The invention is aimed at overcoming this drawback.

SUMMARY OF THE INVENTION

According to the invention, it is proposed to add, to each row of cells of the non-volatile memory (except to the row with the lightest weight), an auxiliary non-volatile memory cell that is placed in a first state during the programming of a cell of the row and is placed in a second state during the erasure of the immediately lower ranking row. Hereinafter, the term "programming" shall be applied to the passage into the first state and the term "erasure" shall be applied to the passage into the second state. The notions of programming are therefore interchangeable and depend quite simply on the conventions of use. For example, in an EEPROM, the term "erasure" is conventionally applied to the storage of electrons in a floating gate but the invention is applicable even if a reverse convention is used.

If the memory card should be pulled out of the reader or if it should undergo an untimely power cut between the programming of one cell of the row and the erasure of the next row, then it will preserve an information bit in the memory in the auxiliary cell. When the card is reinserted into a reader, the auxiliary memory cells will be explored. The detection of a cell in the second state will mean that there has been an untimely interruption of the operation between the steps a (cell programming) and b (row erasure) of the recurrence. Furthermore, the concerned row will be known. The row having the immediately lower rank will then be erased before any subsequent countdown step.

Consequently, the invention relates to a memory card (and to the integrated circuit of a card) designed to memorize an account of units, the memory comprising a non-volatile memory organized into a network of N zones of P cells with means for the selective programming of a cell having a rank $i$, $j$ of the memory, i designating the rank of the zone ($i=1$ to N) and j the rank of the cell in the zone ($j=1$ to P), and means for the selective erasure of all the cells of a selected zone, wherein the circuit comprises, associated with each i ranking zone, a non-volatile auxiliary memory cell and means to program this auxiliary cell at the same time as any other cell of the i ranking zone and to erase this auxiliary cell at the same time as the cells of the $i-1$ ranking zone are erased.

According to an advantageous embodiment, the integrated circuit has an address counter whose heavyweight outputs are used to designate an i ranking zone and whose lightweight outputs are used to designate a j ranking cell in the zones; it is provided then that there will be circuits controlled by the heavyweight outputs of the counter, these circuits being capable, when the i ranking zone is selected by the counter, of applying programming potentials to a cell of the zone having the rank i and to the auxiliary associated cell having the rank i, and capable, without any change in the state of the counter, i.e. always when the row i is selected, of applying erasing potentials to the cells of the zone having the rank $i-1$ ($i>1$) and to the auxiliary cell having the rank i.

With this arrangement, it will be seen that it becomes very easy to carry out the recurrent countdown procedure, even with a highly simplified protocol of communications between the memory card and a card reader in which it is inserted. Indeed, most of the eight-contact card-reading protocols stipulate a very small number of possible instructions such as: the incrementation of the counter, the reading of the state of a designated cell, the programming of the designated cell, the erasure of the row. The invention makes it possible to carry out the recurrent procedure without any need to make the counter return backwards despite the fact that it must erase an $i-1$ ranking low after having programmed an i ranking row.

The non-volatile memory cells and the auxiliary cells will preferably be constituted by an assembly that is series-connected with a selection transistor and a floating-gate transistor.

As shall be seen, the control gates of the floating-gate transistor of the $i-1$ ranking zone will be connected to the control gate of the floating-gate transistor of the auxiliary cell having the rank i.

The preferred particular features of assembly according to the invention shall be described in detail further below.

Apart from the memory card circuit and the corresponding memory card, the invention also relates to a method for the counting down of units in a synchronous card under the control of a card reader.

The method according to the invention is a method for the counting down of units of account from a memory card containing a non-volatile memory organized in a network of N zones of P cells, each zone having a weight that is P times the weight of the immediately lower ranking zone. To make a countdown by one unit, the method consists in carrying out the following recurrent procedure: making a search for the first erased cell by going through the memory according to the rising order of rank of the zones, programming this cell and, if the cell is no longer located in the lowest ranking zone, erasing the zone having a rank immediately below that of the cell found and returning to the start of the recurrent program, wherein said method comprises the operations consisting of the programming, at the same time as the erased cell is programmed, of a non-volatile auxiliary memory cell associated with the zone in which the erased cell is located, and then the erasure of this auxiliary cell at the same time as the immediately lower ranking zone is erased.

The countdown protocol will then preferably comprise the following preliminary steps before any countdown procedure, when the power supply to the memory card is turned on: the search for an auxiliary programmed cell and, if an i ranking auxiliary cell is found in the programmed state, then the simultaneous erasure of this i ranking cell and of all the cells of the zone having a rank immediately below $i-1$.

As for the recurrent procedure, it will preferably comprise the steps of incrementing the cell designation counter and of reading the state of the successive cells of the network, starting with the lowest ranking zone, until an erased cell is found, performing a step to program this cell without incrementing the counter and then, if the cell designated by the counter does not belong to the zone having the lowest weight, performing a step of erasure without changing the state of the counter, and the recommencing the recurrent procedure.

BRIEF DESCRIPTION OF THE DRAWINGS

Other features and advantages of the invention shall appear from the following detailed description, made with reference to the appended figures, of which:

FIG. 1 shows the memory according to the invention;

FIG. 2 shows the graphs of potentials applied during a cell programming instruction;

FIG. 3 shows the graphs of potentials applied during a row erasing operation;

FIG. 4 shows the graphs of potentials during steps for the reading of a cell of the network and of an auxiliary cell.

MORE DETAILED DESCRIPTION

FIG. 1 shows the memory in the exemplary case where the memory zones representing the respective weights of the units of account are eight-cell rows (P=8) and where there are three rows with increasing weights (N=3), the bottom row being the row with the lowest weight.

Preferably, each non-volatile memory cell (C(i, j) has a selection transistor TS and a floating-gate transistor TGF. The transistors are referenced with an ij,i type index, i representing the number of the row starting from the bottom (lighter weight) and j the number of the column.

The floating-gate transistor TGF has its source connected to a conductor AG1 which is common to all the cells and may be either grounded or left floating. The floating gates of all the floating-gate transistors of the same i ranking row are connected together to the source of a control transistor having the same rank i (TC1, TC2, TC3); the gate of this control transistor TC1, TC2 or TC3 is controlled by an i ranking word line conductor. For example, for the row 1, the gates of the floating-gate transistor are all connected to the source of a control transistor TC1 whose gate is connected to a word line conductor WL1.

The transistors TC1, TC2, TC3 have their drain connected to a common conductor CG1 that is used to apply a reading, programming or erasing potential to the gate of the floating-gate transistors of a row that is selected (by a word line).

The selection transistor TS of a cell has its source connected to the drain of the floating-gate transistor TGF of the same cell. All the selection transistors TS of a same i ranking row are connected to the word line having the same rank. Finally, the selection transistor has its drain connected to a bit line BLj having a rank j for the cell having the rank j. The j ranking bit line connects the drains of the selection transistors of all the cells of the j ranking column.

The bit lines BL0, BL1, . . . BLj, . . . are connected to the outputs of a column multiplexer MUX that enables the selection of a column of cells in the network.

A counter CPT, which may be incremented or reset at zero by the memory card reader, is used to designate a determined cell (C(i, j) of the network of N rows and P columns. The heavyweight outputs of the counter select an i ranking row among N, with i increasing as and when the counting proceeds. The lightweight outputs control the multiplexer in order to successively designate the various cells of a row as and when the counting proceeds. It is thus possible, by incrementation of the counter, to go through the memory in the rising order of values of i and in the rising order of values of j for i as a given value.

The column multiplexer is furthermore connected to a read amplifier SA which gives an information element, at its output S, on the state of a cell designated by a determined word line and a determined bit line. This output S is accessible by a card reader to carry out the information exchanges between the card and the reader.

The multiplexer MUX furthermore enables the application, to a bit line that is selected (by the lightweight values of the counter CPT), of a zero potential for erasure or a high potential for programming. These potentials are sent out by a writing circuit designated by WRC.

For each i ranking row, except the first one (i=1), there is provided an auxiliary non-volatile memory cell. This cell has an auxiliary floating-gate transistor TGFA2 or TGFA3 for the rows 2 and 3, and an auxiliary selection transistor TSA2 and TSA3 respectively. Furthermore, an auxiliary control transistor, TCA2 and TCA3 respectively, is associated with each auxiliary cell.

The auxiliary floating-gate transistor of the i ranking row has its gate connected to the source of the auxiliary control transistor having the same rank, and its drain is connected to the source of the auxiliary selection transistor having the same rank. The sources of the auxiliary floating-gate transistors are all connected to a control conductor AG2 which plays a role similar to that of the conductor AG1, i.e. it can be grounded or left in a floating state (but independently of the conductor AG1).

The gate of the i ranking auxiliary selection transistor and the gate of the i ranking auxiliary control transistor are connected to the word line conductor having the same rank i.

All the drains of all the auxiliary selection transistors are connected to a common conductor BLDEC which plays the role of a bit line for the auxiliary memory cells as shall be described in detail further below.

The drains of all the auxiliary control transistors are connected to a common conductor CG2 which plays about the same role as the conductor CG1 and can be taken, independently of CG1, to a reading potential (1 to 5 volts), a programming potential (ground potential of zero volt) or erasure voltage (15 to 20 volts).

Finally, the gate of the i ranking auxiliary floating-gate transistor is connected to the gates of all the floating-gate transistors of the row having the immediately lower rank i−1. It is thus that the gate of the transistor TGFA3 is connected to all the gates of the floating-gate transistors of the second row; and the gate of the transistor TGFA2 is connected to the gates of the floating-gate transistors of the first row.

The conductor BLDEC acts as a bit line for the auxiliary non-volatile cells. In the mode of reading the state of the auxiliary cells, it enables the state of these cells to be transmitted to the output S of the integrated circuit. In the mode of programming an i ranking row, it transmits a programming voltage level (20 volts for example) in the same way and at the same time as a bit line selected by the multiplexer transmits a level of programming voltage (20 volts) to a designated memory cell. Finally, in erasure mode, it is grounded at the same time as the bit lines of the memory are grounded. The conductor BLFEC is represented as being connected to the reading amplifier SA and to the writing circuit WRC.

The FIGS. 2, 3 and 4 specify the signals that must be applied to the different conductors to carry out a programming, an erasure or a reading of a memory cell.

For the programming of a cell of the network at the intersection of the row i and the column j, the conductor CG1 is grounded, the conductor AG1 is connected to a floating potential, the word line WLi of the designated row (i=1 to N) is taken to 20 volts for example to make the i ranking control transistors (TC1, TC2 or TC3) and all the selection transistors of the cells of the row i conductive at the same time. The bit line BLj of the designated cell is taken to a programming voltage of about 20 volts.

Similarly, for the programming of an auxiliary cell of the row i, CG2 is grounded, AG2 is floating, the i ranking auxiliary selection transistor (TSA2 or TSA3) is on, as also is the auxiliary command transistor (TCA2 or TCA3) having the same rank.

Since the programming of a cell of the row i of the network must be done at the same time as the programming of the auxiliary cell of the same row, the corresponding timing diagrams are shown simultaneously in FIG. 2.

In order to erase a i–1 ranking row of the network, the particular feature of the invention is that (contrary to the usual practice) the conductor CG1 (which should be taken to 20 by the designation by the i–1 ranking word line of the word to be erased) is not used.

Here, the row i will be selected artificially while it is sought to erase the row i–1. And it is the conductor CG2 that will be taken to 20 volts and not the conductor CG1. The conductor CG1 is grounded or floating. This will protect the selected i ranking row against an erasure. The i ranking word line is taken to a potential that makes the control transistor of this i ranking row conductive. The control transistor of the row i–1 remains off, thus preventing the gates of the floating-gate transistors of this row i–1 from being grounded. However, on the other hand, these gates receive the voltage present at the source of the auxiliary control transistor of the row i. This transistor is conductive because it is controlled by the i ranking word line that is selected: CG2 is the 20-volt erasing voltage. This voltage is therefore recovered at the gates of the floating-gate transistor of the entire row i–1 at the same time, furthermore, as it is received at the gate of the floating-gate transistor of the row i. The conductor AG1 and the conductor AG2 are grounded. All these floating-gate transistors are therefore subjected to erasing.

FIG. 3 gives a summary view of this procedure for erasing the cells of the row i–1 and the auxiliary i ranking cell. It will be seen that, just as all the bit lines of the network are grounded during this procedure of erasure, so the auxiliary bit line BLDEC is grounded.

For the reading, a choice must be made between reading the state of a cell of the network (AG1 is then connected to the ground, or else it is left in a floating state) or, on the contrary, the state of the auxiliary cell (AG2 is then connected to the ground or else it is left floating). The i ranking word line conductor has its word line taken to a potential that makes the selection transistors and control transistor having the rank i conductive. The conductor CG1 is taken to a reading potential of about 1 to 5 volts, for example 2 volts. If AG1 is connected to the ground, then it is the state of an i,j ranking cell, designated both by the word line and by the column multiplexer, that is transmitted to the output S. If, on the contrary, AG2 is connected to the ground, then it is the state of the i ranking auxiliary cell that is transmitted to the output.

FIG. 4 gives a summary view of the signals used for the reading operation.

The integrated circuit works as follows, under the control of the card reader whose standard function is to manage the countdown of units stored in the memory.

The card reader, in a standard way, can carry out the following instructions:

initialization, incrementation of the address counter CPT to go through the memory in successively designating the cells of the memory in the order of the cells on one row and in the order of the successive rows from 1 to N, reading of the designated cell, programming of a cell designated by the address counter, erasure of the entire row designated by the heaviest weights of the address counter.

Furthermore, to implement the invention, the reader should be capable of giving a specific instruction for reading the auxiliary memory cell of the row designated by the heavy weights of the address counter. This instruction is different from the instruction for reading any memory cell of the network. It indeed corresponds to different potentials as shall be explained with reference to FIG. 4.

During the insertion of a card, the reader first carries out a procedure for the verification of the state of the auxiliary cells. For this purpose, it initializes the counter and increments it by carrying out a reading of the auxiliary cells of the memory after each heavyweight incrementation, i.e. at each new rank i. The specific reading instruction given at each time connects the conductor AG2 and not the conductor AG1 to the ground.

In general, all the auxiliary cells are in the erased state for, if one of them is programmed, this is because there has been an abnormal interruption of a countdown phase. Hereinafter, we shall return to the verification procedure with reference to the case where a programmed auxiliary cell is detected.

After the verification procedure, the reader may carry out a one-unit countdown procedure. This is a recurrent procedure that begins with an reinitialization of the address counter and a search for the first erased cell by scanning the memory row by row starting with the first row (lightest weight). For this purpose, it successively carries out alternating operations of reading and incrementation. Now, it is an operation for reading the cells of the network. Hence, at each time, it is the conductor AG1 that is set at zero and not AG2.

When an erased cell (i,j ranking cell) is found, the address counter remains blocked and the card reader carries out a sequence comprising a step for the programming of a designated cell followed by a row erasure step without modifying the state of the counter. The procedure, however, stops before the erasure step if the designated cell belongs to the first row. If it belongs to another row, the row erasure is carried out and the recurrent procedure is started again.

The programming instruction, as described here above, gives the following potentials: BLj=20 volts, CG1=CG2=0 volt, AG1 and AG2 floating, BLDEC=20 volts, WLi=20 volts. This programs both the i,j ranking cell and the auxiliary i ranking cell.

There are two possibilities: either the counter designates the first row (i=1) and the one-unit countdown procedure is terminated. Or else it designates another row (i>1) and the procedure must be continued by means of a row erasing instruction.

The erasure instruction is then carried out without changing the state of the counter. This prompts not the erasure of the designated row i but, as explained here above, the simultaneous erasure of all the cells of the row i–1 as well as of the auxiliary i ranking cells. The erasure instruction indeed gives the following potentials simultaneously: CG1= 0, CG2=20v, WLi=20v, BL1=BL2= . . . , etc.=BLDEC=0, AG1=AG2=0.

A countdown procedure is then recommenced: reinitialization of the counter, scanning of the memory to find the first erased cell, etc. The countdown procedure is carried out recurrently until the first erased cell found is truly in the first row. This cell is programmed and the recurrent procedure is terminated.

If it is now assumed that the initial verification, carried out by the reader when the card is powered, shows the presence of an i ranking auxiliary cell in the programmed state, the reader must trigger the operation for erasing the i–1 ranking row before any countdown procedure is carried out.

The counter remains blocked in the position that designates this row i; the erasure instruction as described here above is carried out without changing the state of the counter, which leads to the erasure of the row i–1 and not the row i, and to the simultaneous erasure of the i ranking auxiliary cell. This brings the memory back to a count which is the one that it should have had if the recurrent procedure had not been abnormally interrupted. It is then possible to carry out the recurrent countdown procedure as described here above.

In practice, there is no reading of the auxiliary cell by the reader. This is because of questions of compatibility with existing devices which are not provided with the system of the invention. In this case, the reading of the memory cell and of the auxiliary cell takes place for each external reading instruction. The chronology of the signals shown in FIG. 4 then takes place at each clock pulse. The results of this reading are then stored in two distinct registers, one of these registers representing the state of the memory cell and the other representing the state of the auxiliary cell. The reader can read only the state of the memory cell (except during the testing of the circuit). The procedure for detecting a non-erased auxiliary cell is then the following one:

1. Turning on the power;
2. Reading the memory up to the first row of the counter;
3. Carrying out an instruction for the erasure of the row. If the problem of a cut in current has occurred, then the corresponding auxiliary cell is at zero. In this case, the circuit will permit the erasure of the next row (erasure of the abacus with CG2=20v, CG1=0 or floating, AG1=AG2=0). If not, nothing changes.
4. Incrementation of the row of the counter.

The operation is continued in this way up to the last row.

With this procedure, the circuit will permit the erasure of the row that has not been properly erased without indicating the number of the row to the reader. It is only after this erasure has taken place that the reader will be able to ascertain the specific row in question. In certain circuits, the erasure instruction can be carried out only after a programming instruction. In this case, when the power is turned on, the reader should be positioned on a programmed cell (programmed at 0) of each row of the counter in order to carry out the erasure. Thus, it will not program another bit of the counter at "0". If a row does not have any zeros, the reader will not perform the erasure. This would be unnecessary since, necessarily, there would not have been any problem of a cut in current.

What is claimed is:

1. A integrated circuit for a memory card comprising a non-volatile memory organized into a network of N zones of P cells with means for the selective programming of an i, j ranking cell of the memory, i designating the rank of the zone and j the rank of the cell in the zone, and means for the selective erasure of all the cells of a selected zone wherein said circuit comprises, associated with each i ranking zone, only one non-volatile auxiliary memory cell which is programmed at the same time as any other cell of the i ranking zone and is erased at the same time as the cells of the i–1 ranking zone.

2. An integrated circuit according to claim 1, further including a cell address decoder whose heavyweight values are used to select an i ranking zone and whose lightweight values are used to select a j ranking cell in the selected zone, wherein it includes circuits controlled by the heavyweight outputs of the decoder so that, when the i ranking zone is selected, potentials for the programming potentials of a cell of the i ranking zone and of the auxiliary i ranking cell can be applied to these cells and so that, again when the row i is selected, it is possible to apply potentials for the erasing of the row having the rank i–1 (i>1) and potentials for the erasing of the auxiliary i ranking cell.

3. An integrated circuit according to claim 1, wherein the non-volatile memory cells of the network and the auxiliary cells each comprise a selection transistor and a floating-gate transistor, the floating-gate transistors of the cells of an i–1 ranking zone of the network having a control gate connected to the control gate of the floating-gate transistor of the auxiliary cell of the zone i, the sources of the floating-gate transistors of the network being connected to a first common conductor and the sources of the auxiliary floating-gate transistors being connected to a second common conductor that is independent of the first one.

4. An integrated circuit according to claim 3, wherein the control gates of the floating-gate transistors of the i ranking zone are connected by an i ranking control transistor to a third common conductor enabling the application of a reading, erasing or programming potential to the i ranking cells, and wherein the control gate of the i ranking auxiliary floating-gate transistor is connected by an auxiliary i ranking control transistor to a fourth common conductor enabling the application of a reading, programming or erasure potential to the i ranking auxiliary cell.

5. An integrated circuit according to claim 4, wherein the i ranking control transistor and the i ranking auxiliary control transistor are controlled by an i ranking word line.

6. An integrated circuit according to claim 3, wherein the selection transistors corresponding to an i ranking zone of the network are controlled by an i ranking word line, and connect the drains of the floating-gate transistors having a same rank j to one and the same bit line having the rank j, wherein the selection transistor of the i ranking auxiliary cell is controlled by the i ranking word line and connects the floating-gate transistor of this auxiliary cell to an auxiliary bit line common to all the auxiliary cells and wherein, to this auxiliary bit line, there is applied the same potential, in programming or erasing mode, as the potential applied to a bit line corresponding to a cell to be programmed or erased in the network.

7. An integrated circuit according to claim 6, wherein the auxiliary bit line is connected to an output of the circuit in order to read the state of the auxiliary cells.

8. A memory card using an integrated circuit according to claim 1.

* * * * *